(12) United States Patent
Li et al.

(10) Patent No.: US 12,356,607 B2
(45) Date of Patent: Jul. 8, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Renhu Li, Hefei (CN); Ming-Hung Hsieh, Hefei (CN); Yong Lu, Hefei (CN); Zhicheng Shi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 572 days.

(21) Appl. No.: 17/805,923

(22) Filed: Jun. 8, 2022

(65) Prior Publication Data

US 2023/0292493 A1 Sep. 14, 2023

Related U.S. Application Data

(63) Continuation of application No. PCT/CN2022/082546, filed on Mar. 23, 2022.

(30) Foreign Application Priority Data

Mar. 14, 2022 (CN) .......................... 202210247624.8

(51) Int. Cl.
H10B 12/00 (2023.01)
(52) U.S. Cl.
CPC ........... *H10B 12/34* (2023.02); *H10B 12/053* (2023.02)
(58) Field of Classification Search
None
See application file for complete search history.

(56) References Cited

U.S. PATENT DOCUMENTS

| 10,153,284 B2 | 12/2018 | Kang et al. |
| 2014/0054689 A1* | 2/2014 | Park ...................... H10B 12/488 |
| | | 257/331 |
| 2014/0063934 A1* | 3/2014 | Oh .......................... H10B 12/34 |
| | | 365/182 |
| 2016/0315088 A1* | 10/2016 | Kang .................... H01L 29/513 |
| 2018/0197866 A1* | 7/2018 | Kang .................. H01L 29/4236 |

FOREIGN PATENT DOCUMENTS

| CN | 106067482 A | 11/2016 |
| CN | 108987282 A | 12/2018 |
| CN | 209312720 U | 8/2019 |
| CN | 110896077 A | 3/2020 |
| CN | 210640255 U | 5/2020 |
| CN | 112331651 A | 2/2021 |

OTHER PUBLICATIONS

International Search Report cited in PCT/CN2022/082546 mailed Dec. 13, 2022, 9 pages.

* cited by examiner

*Primary Examiner* — Michael Lebentritt
(74) *Attorney, Agent, or Firm* — Kilpatrick Townsend & Stockton LLP (57) ABSTRACT

The present disclosure provides a semiconductor structure and a manufacturing method thereof. The semiconductor structure includes a substrate and a word line (WL) structure, wherein the substrate includes trenches arranged in parallel intervals; the WL structure is located in the trenches, and includes a dielectric layer and a conductive layer; the dielectric layer covers a bottom surface and a sidewall of the conductive layer; the conductive layer includes a first conductive layer and a second conductive layer; and a first component is doped in the second conductive layer.

17 Claims, 7 Drawing Sheets

| Provide a substrate, and form trenches arranged in parallel intervals in the substrate | S10 |

↓

| Form a dielectric layer, the dielectric layer covers an upper surface of the substrate and a bottom and a sidewall of the trench | S20 |

↓

| Form a conductive layer in the trench, wherein the conductive layer includes a first conductive layer and a second conductive layer, and a first component is doped in the second conductive layer | S30 |

SEMICONDUCTOR STRUCTURE AND MANUFACTURING METHOD THEREOF

CROSS-REFERENCE TO RELATED APPLICATIONS

This is a continuation of International Application No. PCT/CN2022/082546, filed on Mar. 23, 2022, which claims the priority to Chinese Patent Application No. 202210247624.8, filed with the China National Intellectual Property Administration (CNIPA) on Mar. 14, 2022. The entire contents of International Application No. PCT/CN2022/082546 and Chinese Patent Application No. 202210247624.8 are incorporated herein by reference.

TECHNICAL FIELD

The present disclosure relates to the technical field of semiconductors, and in particular to a semiconductor structure and a manufacturing method thereof.

BACKGROUND

As a semiconductor device commonly used in an electronic device such as a computer, a dynamic random access memory (DRAM) includes a memory cell array for storing data, and a peripheral circuit at the periphery of the memory cell array. Each memory cell includes a transistor (word line (WL)), a bit line (BL) and a capacitor. The transistor can be turned on and off through a voltage on the transistor (WL), such that the BL can read data information in the capacitor, or write data information to the capacitor.

With constant development of the manufacturing process, there are a smaller size of the transistor, and a stronger electric field intensity in the channel of the metal oxide semiconductor (MOS) device. While the process node of the DRAM is scaled to 10 nm or below, the energy density in unit area of the MOS device is increased greatly, which causes a more serious leakage problem and higher power consumption.

SUMMARY

Embodiments of the present disclosure provide a semiconductor structure and a manufacturing method thereof.

According to a first aspect, an embodiment of the present disclosure provides a semiconductor structure, including: a substrate including trenches arranged in parallel intervals; and a WL structure located at a bottom of the trench, and including a dielectric layer and a conductive layer, wherein the dielectric layer covers a bottom surface and a sidewall of the conductive layer, the conductive layer includes a first conductive layer and a second conductive layer, and a first component is doped in the second conductive layer.

According to a second aspect, an embodiment of the present disclosure provides a method of manufacturing a semiconductor structure, including: providing a substrate, and forming trenches arranged in parallel intervals in the substrate; forming a dielectric layer, the dielectric layer covering a bottom and a sidewall of the trench; and forming a conductive layer in the trench, wherein the conductive layer includes a first conductive layer and a second conductive layer, and a first component is doped in the second conductive layer.

Details of one or more embodiments of the present disclosure will be illustrated in the following drawings and description. Other features, objectives, and advantages of the present disclosure become evident in the specification, claims, and accompanying drawings.

BRIEF DESCRIPTION OF THE DRAWINGS

To describe the technical solutions in the embodiments of the present disclosure more clearly, the accompanying drawings required to describe the embodiments are briefly described below. Apparently, the accompanying drawings described below are only some embodiments of the present disclosure. Those of ordinary skill in the art may further obtain accompanying drawings of other embodiments based on these accompanying drawings without creative efforts.

DETAILED DESCRIPTION

To facilitate the understanding of the present disclosure, the present disclosure is described more completely below with reference to the related accompanying drawings. Preferred embodiments of the present disclosure are shown in the drawings. However, the present disclosure may be embodied in various forms without being limited to the embodiments described herein. On the contrary, these embodiments are provided to make the present disclosure more thorough and comprehensive.

Unless otherwise defined, all technical and scientific terms used herein have the same meaning as commonly understood by those skilled in the technical field of the present disclosure. The terms used in the specification of the present disclosure are merely for the purpose of describing specific embodiments, rather than to limit the present disclosure. The term "and/or" used herein includes any and all combinations of one or more of the associated listed items.

In the description of a position relationship, unless otherwise specified, when one element, e.g., a layer or substrate, is referred to as being "on" another film layer, it can be directly located on the other film layer or there may be an intermediate film layer. Further, when a layer is referred to as being "under" another layer, it can be directly under the other layer, or there may be one or more intermediate layers. It can also be understood that, when a layer is referred to as being "between" two layers, it may be the only layer between the two layers, or other may be one or more intermediate layers.

In a case that terms "include", "have", and "contain" in the specification are used, unless clear qualifiers such as "only" and "consist of" are used, another component can be added. Unless the contrary is mentioned, terms in the singular form may include the plural form but are not to be understood as a single one.

In the present disclosure, unless otherwise clearly specified, the terms "provided", "connected with" and "connected to" should be understood in a broad sense. For example, the connection may be a fixed connection, a detachable connection or an integrated connection, may be a direct connection or an indirect connection via an intermediate medium, or may be intercommunication between two components. Those of ordinary skill in the art should understand the specific meanings of the above terms in the present disclosure based on specific situations.

In addition, in the description of the present disclosure, the terms "multiple", "one another", "overlap", "stacked" and "a plurality of" refer to two or more, unless otherwise specified.

With constant development of the manufacturing process, there are a smaller size of the transistor, and a stronger electric field intensity in the channel of the MOS device. While the process node of the DRAM is scaled to 10 nm or below, the energy density in unit area of the MOS device is greatly increased, which causes a more serious leakage problem. If the leakage problem cannot be addressed effectively, the power consumption of the transistor is not lowered with the decrease of the size, but instead is increased. Therefore, the present disclosure provides a semiconductor structure and a manufacturing method thereof, to solve the aggravated leakage problem due to the decreased size of the device, and lower the power consumption.

Figure 1:
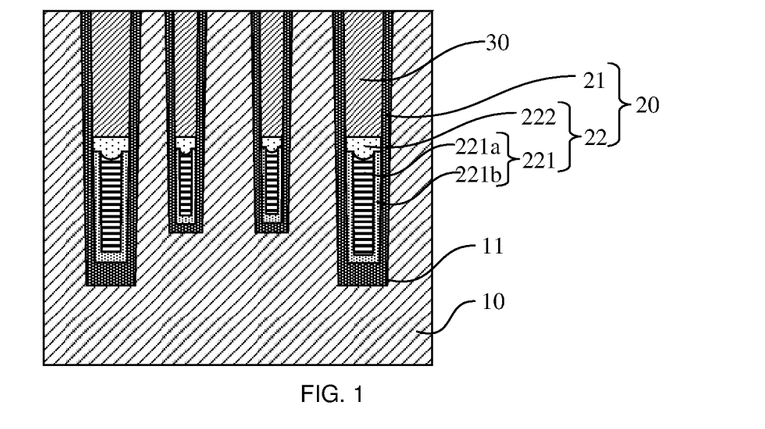
FIG. 1 is a schematic sectional view of a semiconductor structure according to an embodiment of the present disclosure.

As shown in FIG. 1, an embodiment of the present disclosure provides a semiconductor structure, including a substrate 10 and a WL structure 20. The substrate 10 includes trenches 11 arranged in parallel intervals. The WL structure 20 is located in the trenches 11, and includes a dielectric layer 21 and a conductive layer 22. The dielectric layer 21 covers a bottom surface and a sidewall of the conductive layer 22. The conductive layer 22 includes a first conductive layer 221 and a second conductive layer 222. A first component is doped in the second conductive layer 222.

Since the first conductive layer 221 and the second conductive layer 222 have different work functions, the semiconductor structure in the above embodiment can reduce GIDL caused by the WL structure 20. Moreover, by doping the first component in the second conductive layer 222, the semiconductor structure reduces the work function of the second conductive layer 222 and weakens repulsion of the second conductive layer 222 to electrons, which can further reduce the GIDL caused by the WL structure 20, alleviate the leakage problem in the semiconductor device and lower the power consumption.

Exemplarily, the substrate 10 may include, but is not limited to, a silicon substrate 10. The substrate 10 includes active regions and shallow trench isolation (STI) structures arranged in arrays. The active regions are located between adjacent ones of the STI structures. The trenches 11 are intersected with the active regions and the STI structures. The WL structure 20 is located in the trenches 11. The dielectric layer 21 covers the bottom surface and the sidewall of the conductive layer 22 to isolate the conductive layer 22 from the active regions. The dielectric layer 21 may include, but is not limited to, a High-K material layer such as a silicon dioxide layer. The conductive layer 22 includes the first conductive layer 221 and the second conductive layer 222. The first component is doped in the second conductive layer 222. By doping the first component in the second conductive layer 222, the semiconductor structure can reduce the work function of the second conductive layer 222, thereby reducing the GIDL of the WL structure 20 and enhancing the gate control capability.

In an embodiment, referring also to FIG. 1, the second conductive layer 222 is stacked on the first conductive layer 221. The second conductive layer 222 includes a horizontal portion and a protrusive portion. The protrusive portion is embedded into the first conductive layer 221. By providing the protrusive portion in the second conductive layer 222, the semiconductor structure can increase the contact area between the second conductive layer 222 and the first conductive layer 221, which further reduces the GIDL of the WL structure 20, lowers the power consumption, and enhances the gate control capability.

In an embodiment, the first component includes an N-type doping element, such as phosphorus, arsenic or antimony. The second conductive layer 222 may include, but is not limited to, a doped polycrystalline silicon layer. After a certain concentration of the N-type doping element is doped in the second conductive layer 222, there is a higher Fermi level. The work function is considered as a difference between the vacuum level and the Fermi level. The work function of the second conductive layer 222 is reduced once the Fermi level is increased. Taking the doped polycrystalline silicon layer as the second conductive layer 222 for example, after phosphorus elements are doped, the work function is reduced, and the repulsion of the doped polycrystalline silicon layer to electrons is weakened, thereby reducing the GIDL, improving the gate control capability of the WL structure 20, and lowering the power consumption. The Fermi level is the highest energy level that electrons are filled in a solid energy band at the absolute zero temperature and is commonly represented by EF. The vacuum energy is also referred to as a free electron level at which electrons are completely free from the nucleus.

As an example, the first component may have a doping concentration of $18 \times 10^{20}$ cm$^{-3}$ to $22 \times 10^{20}$ cm$^{-3}$, such as $18 \times 10^{20}$ cm$^{-3}$, $19 \times 10^{20}$ cm$^{-3}$, $20 \times 10^{20}$ cm$^{-3}$, $21 \times 10^{20}$ cm$^{-3}$ or $22 \times 10^{20}$ cm$^{-3}$.

Optionally, in some embodiments, a doping concentration of the first component changes gradually along a thickness direction of the second conductive layer 222. As an example, the doping concentration of the first component changes stepwise along the thickness direction of the second conductive layer 222. For example, the doping concentration of the first component is decreased gradually along the direction from the protrusive portion to the horizontal portion, or the doping concentration of the first component is increased gradually along the direction from the protrusive portion to the horizontal portion. By providing the first component with the gradually-changing doping concentration in the second conductive layer 222, different work functions may be formed at different positions of the second conductive layer 222, which further reduces the GIDL, and improves the gate control capability of the WL structure 20.

In an embodiment, referring also to FIG. 1, the first conductive layer 221 includes a metal layer 221a and a metal barrier layer 221b. The metal barrier layer 221b covers a bottom surface and a sidewall of the metal layer 221a, and exposes a top of the metal layer 221a. The protrusive portion is embedded into the top of the metal layer 221a. A lateral size of the protrusive portion of the second conductive layer 222 is less than that of the horizontal portion of the second conductive layer 222. A bottom surface of the horizontal portion contacts a top of the metal barrier layer 221b. A sidewall of the horizontal portion of the second conductive layer 222 contacts a part of a sidewall of the dielectric layer 21. That part of the dielectric layer 21 is prone to damage when the WL structure is formed by etching, thereby causing the GIDL easily. The present disclosure adjusts the work function of the second conductive layer 222 by doping, such that the repulsion of the second conductive layer 222 to the electrons is weakened to reduce the GIDL.

Exemplarily, the metal layer 221a may be a metal conductive material layer with a low resistivity, such as a tungsten layer or a copper layer. The metal barrier layer 221b may select a material layer with a barrier function to the metal layer 221a. Furthermore, the metal barrier layer 221b further has a high resistivity, and can be attached well between the semiconductor and the metal. Exemplarily, the metal barrier layer 221b may include, but is not limited to, a titanium nitride layer, a cobalt layer, a platinum layer or a titanium-tungsten layer. Taking the tungsten layer as the metal layer 221a, the titanium nitride layer as the metal barrier layer 221b and the phosphorus-doped polycrystalline silicon layer as the second conductive layer 222 for example, the protrusive portion is embedded into the top of the tungsten layer. With a difference between work functions of the doped polycrystalline silicon layer and the tungsten layer, the GIDL of the WL structure 20 is reduced, thereby lowering the power consumption caused by the leakage current, and improving the gate control capability of the WL structure 20. As shown in FIG. 1, the doped polycrystalline silicon layer includes the horizontal portion and the protrusive portion. The horizontal portion is located on the protrusive portion, with the size greater than that of the protrusive portion. The bottom surface of the horizontal portion contacts the top of the titanium nitride layer. The protrusive portion includes a protrusive surface contacting the top surface of the tungsten layer.

In an embodiment, as shown in FIG. 1, the semiconductor structure further includes a protective layer 30 located on an upper surface of the second conductive layer 222, and filling up the trenches 11. An upper surface of the protective layer 30 is flush with an upper surface of the substrate 10. As an example, the protective layer 30 may be made of a material including but not limited to silicon nitride or silicon oxynitride. The protective layer 30 can isolate the conductive layer 22 from the outside to protect the conductive layer 22.

Figure 2:
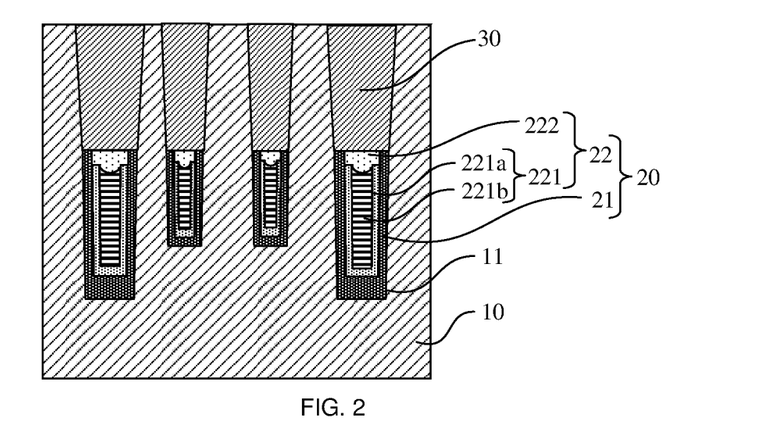
FIG. 2 is a schematic sectional view of a semiconductor structure according to another embodiment of the present disclosure.

Optionally, in some embodiments, as shown in FIG. 2, an upper surface of the dielectric layer 21 is flush with the upper surface of the second conductive layer 222. The protective layer 30 covers the upper surface of the dielectric layer 21 and the upper surface of the second conductive layer 222.

By providing the protective layer 30 on the dielectric layer 21, the semiconductor structure can prevent the dielectric layer 21 from being damaged by other processes (such as wet etching or dry etching) in subsequent manufacture, and thus makes the device more stable.

Figure 3:
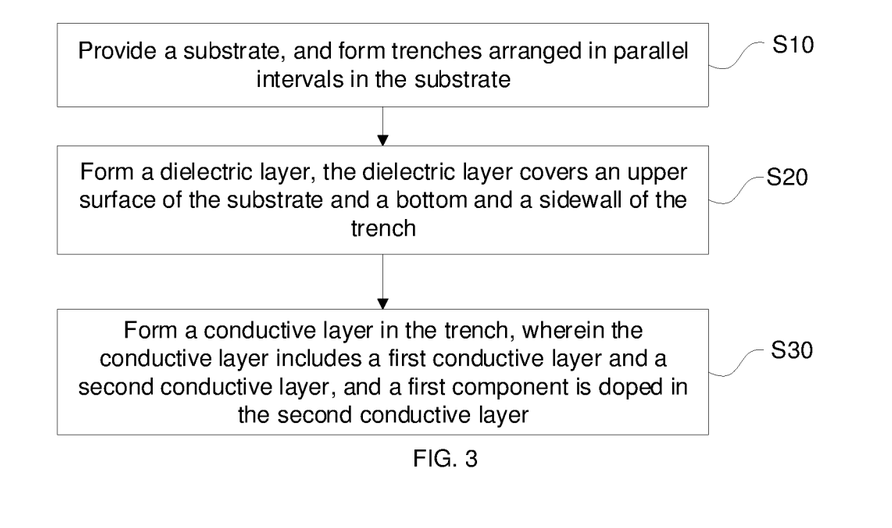
FIG. 3 is a flowchart of a method of manufacturing a semiconductor structure according to an embodiment of the present disclosure.

As shown in FIG. 3, the present disclosure further provides a method of manufacturing a semiconductor structure, including the following steps:

Step S10: Provide a substrate 10, and form trenches 11 arranged in parallel intervals in the substrate 10.

Step S20: Form a dielectric layer 21, the dielectric layer 21 covering an upper surface of the substrate 10 and a bottom and a sidewall of the trench 11.

Step S30: Form a conductive layer 22 in the trench 11, wherein the conductive layer 22 includes a first conductive layer 221 and a second conductive layer 222, and a first component is doped in the second conductive layer 222.

The first conductive layer 221 and the second conductive layer 222 made of different materials are formed in the trenches 11, and the first conductive layer 221 and the second conductive layer 222 have different work functions, so the method of manufacturing a semiconductor structure reduces GIDL of the WL structure 20. Moreover, by doping the first component in the second conductive layer 222, the method of manufacturing a semiconductor structure reduces the work function of the second conductive layer 222 and weakens repulsion of the second conductive layer 222 to electrons, which can further reduce the GIDL caused by the WL structure 20, alleviate the leakage problem in the semiconductor device and lower the power consumption.

Figure 4:
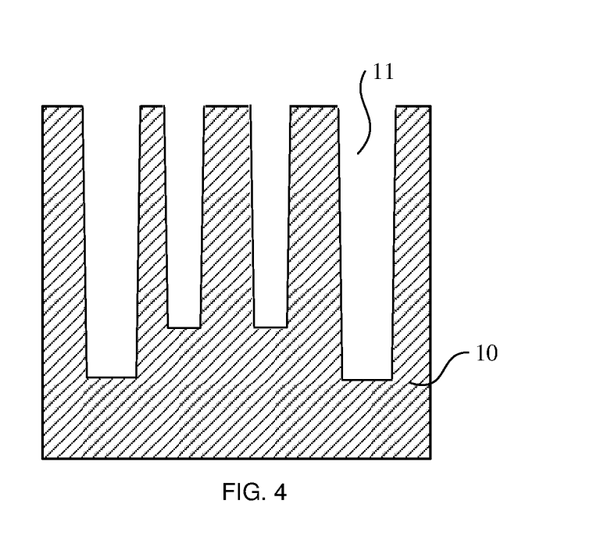
FIG. 4 is a schematic sectional view after a trench is formed in a substrate according to an embodiment of the present disclosure.

In an embodiment, a plurality of STI structures (not shown in the figure) are formed in the substrate 10 in Step S10. In the substrate 10, the STI structures isolate a plurality of active region (not shown in the figure) arranged in arrays. As an example, the STI structures may be made of a material including but not limited to silicon oxide and silicon nitride. The substrate 10 may include, but is not limited to, a silicon substrate 10. Exemplarily, the step of forming trenches 11 in the substrate 10 includes: Deposit a hard mask layer on the upper surface of the substrate 10, form a pattern in the hard mask layer by patterning, define positions and sizes of the trenches 11, and etch the substrate 10 by photoetching to form the trenches 11 arranged in parallel intervals, as shown in FIG. 4. Exemplarily, the trenches 11 are intersected with the active regions and the STI structures.

As an example, the trenches 11 each may have a depth of 50-300 nm, such as 50 nm, 100 nm, 150 nm, 200 nm or 300 nm. The trenches 11 each may have a critical dimension (CD) of 20-100 nm, such as 20 nm, 30 nm, 50 nm, 70 nm or 100 nm.

In some embodiments, the trenches 11 each may be provided with a first portion and a second portion. The first portion is wider than the second portion. The wider first portion is intersected with the active region, and the narrower second portion is intersected with the STI structure.

Figure 5:
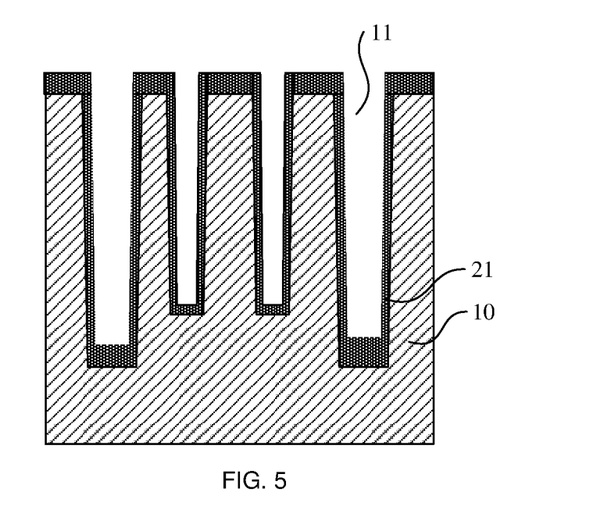
FIG. 5 is a schematic sectional view of a semiconductor structure after a dielectric layer is formed according to an embodiment of the present disclosure.

In Step S20, the dielectric layer 21 is formed, and the dielectric layer 21 covers the bottoms and the sidewalls of the trenches 11 as well as the upper surface of the substrate 10, as shown in FIG. 5.

Exemplarily, the dielectric layer 21 may include, but is not limited to, a High-K material layer such as a silicon dioxide layer. The dielectric layer 21 may be formed on the bottoms and the sidewalls of the trenches 11 as well as on the upper surface of the substrate 10 by in-situ steam generation (ISSG). Optionally, the dielectric layer 21 may further be formed by atomic layer deposition (ALD), plasma vapor deposition (PVD) or rapid thermal oxidation (RTO).

In Step S30, the conductive layer 22 is formed in the trenches 11, the conductive layer 22 includes the first conductive layer 221 and the second conductive layer 222, and the first component is doped in the second conductive layer 222, as shown in FIGS. 6-10.

Exemplarily, the step of forming a conductive layer 22 in the trenches 11 includes:

S31: Form the first conductive layer 221 in the trenches 11, the first conductive layer 221 including a metal layer 221a and a metal barrier layer 221b.

S32: Form the second conductive layer 222 on the first conductive layer 221.

Figure 6:
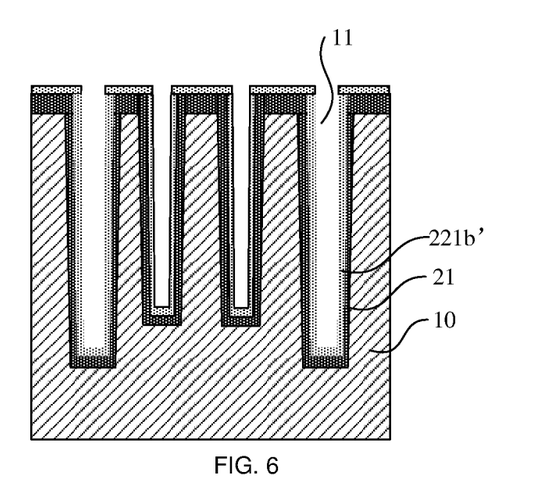
FIG. 6 is a schematic sectional view of a semiconductor structure after a metal barrier material layer is formed according to an embodiment of the present disclosure.

In Step S31, the step of forming the first conductive layer 221 may include:

Step S311: Form a metal barrier material layer 221b', the metal barrier material layer 221b' covering a surface of the dielectric layer 21, as shown in FIG. 6.

Exemplarily, the metal barrier material layer 221b' may be a material layer with a good barrier function to metal and semiconductor materials, such as a titanium nitride layer, a cobalt layer, a platinum layer or a titanium-tungsten layer. Optionally, the metal barrier material layer 221b' may further have a high resistivity, and is attached well between the semiconductor and the metal. As an example, the metal barrier material layer 221b' may be formed by chemical vapor deposition (CVD), ALD, PVD or RTO.

Figure 7:
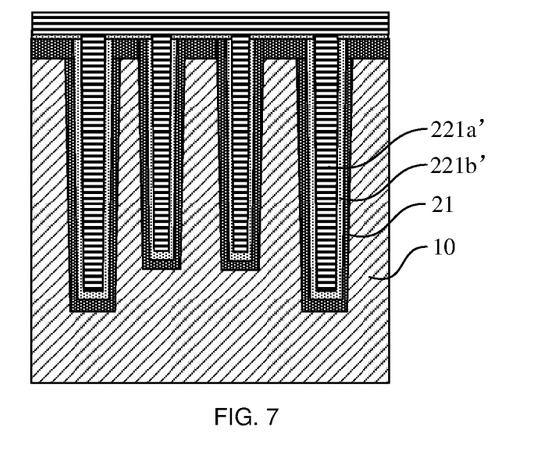
FIG. 7 is a schematic sectional view of a semiconductor structure after a metal material layer is formed according to an embodiment of the present disclosure.

S312: Form a metal material layer 221a', the metal material layer 221a' covering a surface of the metal barrier material layer 221b', and filling up the trenches 11, as shown in FIG. 7.

Exemplarily, the metal material layer 221a' may be made of a metal conductive material with a low resistivity, including but not limited to tungsten (W), molybdenum (Mo), titanium (Ti), copper (Cu) or gold (Au). As an example, the metal material layer 221a' may be formed on the surface of the metal barrier material layer 221b' by CVD, and the formed metal material layer 221a' fills up the trenches 11.

S313: Remove a part of the metal material layer 221a' and a part of the metal barrier material layer 221b' to form the metal layer 221a and the metal barrier layer 221b, thereby obtaining the first conductive layer 221, as shown in FIG. 8.

Exemplarily, the part of the metal material layer 221a' and the part of the metal barrier material layer 221b' may be removed by etching. For example, the metal material layer 221a' and the metal barrier material layer 221b' on the substrate 10 may be removed by dry etching. The metal material layer 221a' and the metal barrier material layer 221b' are etched continuously until a distance from a top surface of each of the metal material layer 221a' and the metal barrier material layer 221b' to a top surface of the active region reaches a first preset distance. Exemplarily, the first preset distance may be 75-85 nm, such as 75 nm, 80 nm or 85 nm. Any distance from the top surface of each of the metal material layer 221a' and the metal barrier material layer 221b' to the top surface of the active region within 75-85 nm meets the requirements of the present disclosure and will not be listed herein. By controlling the distance from the top surface of each of the metal material layer 221a' and the metal barrier material layer 221b' to the top surface of the active region within the first preset distance, the channel length can be controlled within a reasonable range, and thus the gate control capability can be improved.

Figure 8:
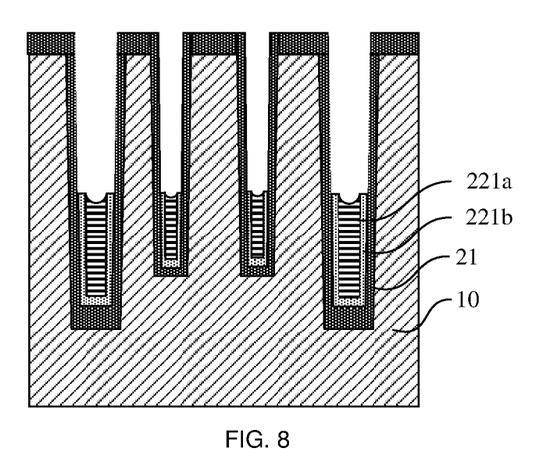
FIG. 8 is a schematic sectional view of a semiconductor structure after a first conductive layer is formed according to an embodiment of the present disclosure.

Optionally, in some embodiments, an etching rate to the metal material layer 221a' can be increased by adjusting an etch selectivity of an etching gas to each of the metal material layer 221a' and the metal barrier material layer 221b', thereby forming an curved recess in a top surface of the first conductive layer 221, as shown in FIG. 8. For example, a gas having a high etching rate to the metal material layer 221a' can be charged near the end of the etching.

As an example, the metal material layer 221a' is a tungsten layer, the metal barrier material layer 221b' is a titanium nitride layer, and chlorine ($Cl_2$) is charged to the chamber near the end of the dry etching. As the chlorine has a faster etching rate to the tungsten layer than other materials, the top of the tungsten layer is recessed downward with the continuation of the etching to form the curved recess gradually. Optionally, the depth or shape of the curved recess may be controlled by controlling the charging occasion, charging rate and charging time of the chlorine. By forming the curved recess in the top of the first conductive layer, a protrusive portion protruding downward may be formed in the second conductive layer 222 when the second conductive layer 222 is formed on the upper surface of the first conductive layer, thereby increasing a contact area between the second conductive layer and the first conductive layer.

Figure 9:
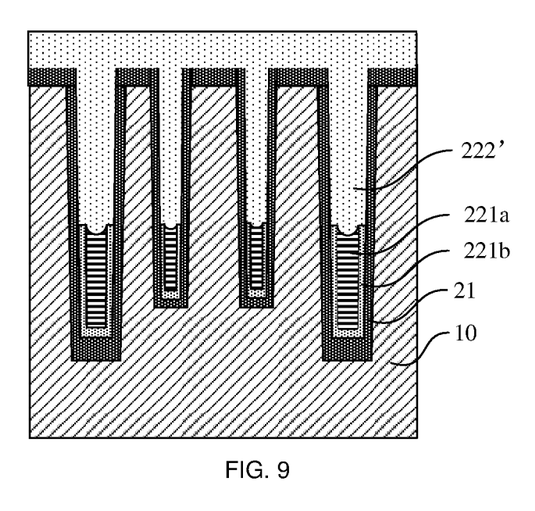
FIG. 9 is a schematic sectional view of a semiconductor structure after a second conductive material layer is formed according to an embodiment of the present disclosure.

In Step S32, the step of forming the second conductive layer 222 includes:

S321: Form a second conductive material layer 222', and dope the first component in the second conductive material layer 222', the second conductive material layer 222' covering the top surface of the first conductive layer 221 and the surface of the dielectric layer 21, and filling up the trenches, as shown in FIG. 9.

Figure 10:
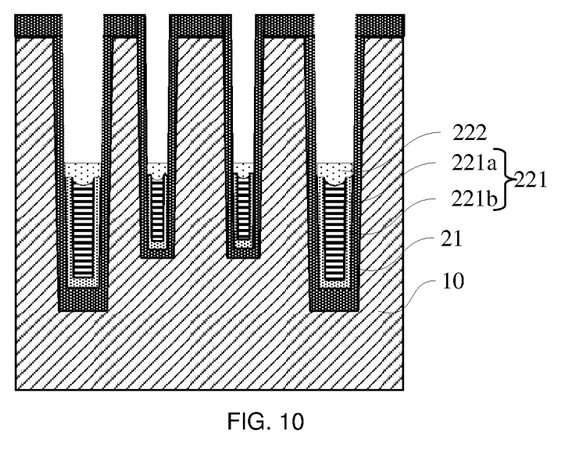
FIG. 10 is a schematic sectional view of a semiconductor structure after a second conductive layer is formed according to an embodiment of the present disclosure.

S322: Remove a part of the second conductive material layer 222' to form the second conductive layer 222, as shown in FIG. 10.

Exemplarily, the second conductive material layer 222' may include, but is not limited to, a doped polycrystalline silicon layer. In Step S321, the second conductive material layer 222' may be formed by CVD, ALD or PVD. Preferably, the second conductive material layer 222' may be generated on the upper surface of the first conductive layer 221 and the surface of the dielectric layer 21 by low-pressure CVD (LPCVD). The device to be used may be a furnace tube, and may also be a chamber device or other devices in single-chip operation. The LPCVD in the furnace tube has the advantages of low deposition temperature, easily controllable thin-film component and thickness, direct proportionality between the thin-film thickness and the deposition time, good uniformity and repeatability, good step coverage capability, convenience in operation, etc.

In some embodiments, while the polycrystalline silicon layer is grown, the first component may be charged to the furnace tube, thereby forming the first component doped polycrystalline silicon layer. The first component may be, for example, an N-type doping element such as phosphorus, arsenic or antimony.

Specifically, the step of manufacturing the doped polycrystalline silicon layer with the furnace tube may include: Place the substrate 10 into the furnace tube, and charge silane and phosphorane to the furnace tube, phosphorus decomposed from the phosphorane being doped in silicon. The polycrystalline silicon layer is generated mainly based on the following chemical formula: $SiH_4(g) \rightarrow Si(s)+$ 2H$_2$(g). The phosphorane is decomposed based on the following formula: PH$_3$(phosphorane)→P+3H. The phosphorus decomposed from the phosphorane is doped in the silicon decomposed from the silane. Exemplarily, the silane is charged to the furnace tube at a flow rate of 200 sccm to 20,000 sccm, and the phosphorane is charged to the furnace tube at a flow rate of 10 sccm to 500 sccm.

During deposition of the polycrystalline silicon layer, the silane is decomposed into a plurality of particles, atoms, free radicals and ions. These particles are deposited on the substrate 10 through a series of complex processes such as migration and dehydrogenation. As an example, the polycrystalline silicon layer is deposited at 400-600° C. The heating furnace tube is available for batch deposition, in which hundreds of wafers (such as 100 wafers, 150 wafers or 200 wafers) can be placed on the vertical wafer boat at a time. Within set time, a fixed amount of reactive gas is charged to the reaction furnace from the bottom of the reaction chamber of the heating furnace tube or from the ejection quartz tube. The doped polycrystalline silicon layer can be simultaneously deposited on all surfaces of the wafers at a set temperature. Exemplarily, as shown in FIG. 9, the doped polycrystalline silicon layer fills up the trenches 11, and covers the surface of the dielectric layer 21 on the substrate 10.

As an example, the first component may have a doping concentration of $18 \times 10^{20}$ cm$^{-3}$ to $22 \times 10^{20}$ cm$^{-3}$, such as $18 \times 10^{20}$ cm$^{-3}$, $19 \times 10^{20}$ cm$^{-3}$, $20 \times 10^{20}$ cm$^{-3}$, $21 \times 10^{20}$ cm$^{-3}$ or $22 \times 10^{20}$ cm$^{-3}$. Any doping concentration of the first component within the range of $18 \times 10^{20}$ cm$^{-3}$ to $22 \times 10^{20}$ cm$^{-3}$ meets the requirements of the present disclosure, and will not be listed herein.

Optionally, in some implementations, a doping concentration of the first component at different positions in the second conductive material layer 222' may be adjusted by adjusting a rate for charging the first component, such that the doping concentration of the first component changes gradually along a thickness direction of the second conductive material layer 222'. As an example, the silane is charged to the furnace tube to serve as a silicon source, and the phosphorane is charged to the furnace tube to serve as a phosphorus source. For example, the phosphorane is charged to the device at a flow rate of 500 sccm during an early growth stage of the polycrystalline silicon layer. As the polycrystalline silicon layer grows and becomes thicker, the rate for charging the first component is decreased gradually. For example, the phosphorane is charged at a flow rate of 50 sccm by the end of the growth of the polycrystalline silicon layer. During the growth, the flow rate for charging the phosphorane is decreased uniformly.

Optionally, during the early growth stage of the polycrystalline silicon layer, the first component may further be charged to the furnace tube at a low rate. As the polycrystalline silicon layer grows and becomes thicker, the rate for charging the first component is increased gradually. For example, the phosphorane is charged to the device at a flow rate of 50 sccm during the early growth stage of the polycrystalline silicon layer. As the polycrystalline silicon layer grows and becomes thicker, the rate for charging the first component is increased gradually. For example, the phosphorane is charged at a flow rate of 500 sccm by the end of the growth of the polycrystalline silicon layer. During the growth, the flow rate for charging the phosphorane is increased uniformly.

Optionally, during the early growth stage of the polycrystalline silicon layer, the first component may further be charged to the furnace tube at a low rate. As the polycrystalline silicon layer grows and becomes thicker, the rate for charging the first component is increased gradually. A maximum of the doping concentration is preset. Once the doping concentration reaches the maximum, the rate for charging the first component is decreased gradually. The doping concentration of the first component in the second conductive layer is increased first and then decreased.

Optionally, during the early growth stage of the polycrystalline silicon layer, the first component may further be charged to the furnace tube at a high rate. As the polycrystalline silicon layer grows and becomes thicker, the rate for charging the first component is decreased gradually. A minimum of the doping concentration is preset. Once the doping concentration reaches the minimum, the rate for charging the first component is increased gradually. The doping concentration of the first component in the second conductive layer is decreased first and then increased.

The work function of the polycrystalline silicon layer may change by performing N-type doping on the polycrystalline silicon layer. The work function is defined as minimum energy required to move an electron from the inside of the object to the surface of the object. A larger work function means that the electron is harder to leave the object. With the N-type doping on the polycrystalline silicon layer, there is a higher Fermi level (Ef). Because of the work function $\phi$=a difference between the vacuum energy (Ev) and the Fermi level (Ef), namely $\phi$=Ev−Ef, the work function is reduced as the Fermi level is increased. After the work function is reduced, the repulsion of the doped polycrystalline silicon layer to the electrons is weakened, which reduces the GIDL of the WL structure 20, lowers the power consumption of the device, and improves the gate control capability. Elements for performing the N-type doping on the second conductive layer may include: one or a combination of arsenic, phosphorus and antimony. The work function of the second conductive layer may also be adjusted by doping various elements, thereby improving the GIDL effect of the gate structure.

In Step S322, exemplarily, the second conductive material layer 222' on the substrate 10 may be removed by etching. The second conductive material layer 222' in the trenches 11 is etched continuously to make the second conductive material layer 222' thin, until a distance from the top surface of the second conductive material layer 222' to the upper surface of the active region reaches a second preset distance, thereby obtaining the second conductive layer 222. Exemplarily, the second preset distance may be 55-65 nm, such as 55 nm, 60 nm or 65 nm. Any distance from the top surface of the second conductive material layer 222' to the upper surface of the active region within 55-65 nm meets the requirements of the present disclosure and will not be listed herein.

As an example, if the first component is charged uniformly during the manufacturing process of the second conductive material layer 222', the obtained second conductive layer 222 has a uniform doping concentration. If the rate for charging the first component changes (is increased or decreased) as the polycrystalline silicon layer becomes thicker, the doping concentration of the first component in the second conductive layer 222 changes gradually along the thickness direction. Exemplarily, as shown in FIG. 10, an upper surface of the second conductive layer 222 is lower than the upper surface of the substrate 10.

Figure 11:
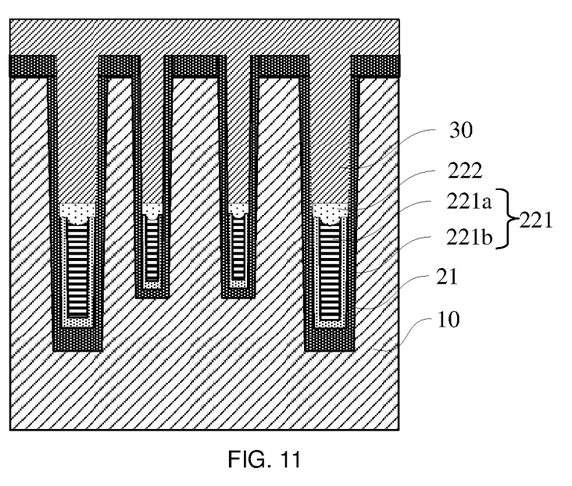
FIG. 11 is a schematic sectional view of a semiconductor structure after a protective layer is formed according to an embodiment of the present disclosure.

In some embodiments, after the second conductive layer 222 is formed, the method of manufacturing a semiconductor structure further includes:

S40: Form a protective layer 30, the protective layer 30 covering the upper surface of the second conductive layer 222 and the surface of the dielectric layer 21, and filling up the trenches 11, as shown in FIG. 11.

Exemplarily, the protective layer 30 may be a High-K material layer, such as a silicon nitride layer or a silicon oxynitride layer. As an example, the protective layer 30 may be formed by ALD or PVD. The protective layer 30 covers the upper surface of the second conductive layer 222, and fills up the trenches 11.

Preferably, the protective layer 30 may be formed by LPCVD in the furnace tube. The protective layer 30 generated in the furnace tube has the desirable uniformity and compactness. Exemplarily, as shown in FIG. 11, the protective layer 30 is formed on the upper surface of the second conductive layer 222. The protective layer 30 fills up the trenches 11, and extends to the substrate 10.

Further, the protective layer 30 and the dielectric layer 21 may be planarized by wet etching, dry etching, chemical mechanical polishing (CMP) or lateral etching along the thickness direction, until the upper surface of the substrate 10 is exposed, as shown in FIG. 1. Both the upper surface of the dielectric layer 21 and the upper surface of the protective layer 30 are flush with the upper surface of the substrate 10. The protective layer 30 can isolate the conductive layer 22 from the outside to protect the conductive layer 22.

The present disclosure further provides a method of manufacturing a semiconductor structure, to form the semiconductor structure shown in FIG. 2. The method includes Step S10, Step S20, Step S30 and Step S40 in the above embodiment, and differs from the above method in: before Step S40, the dielectric layer 21 exposed in the trenches 11 is removed, as shown in FIG. 12.

Specifically, upon formation of the conductive layer 22, the dielectric layer 21 exposed in the trenches 11 may be removed by dry etching. For example, the dielectric layer 21 on inner walls of the trenches 11 is etched directionally with plasma etching to expose sidewalls of the active regions. In this case, the top surface of the dielectric layer 21 is flush with the upper surface of the second conductive layer 222.

Figure 13:
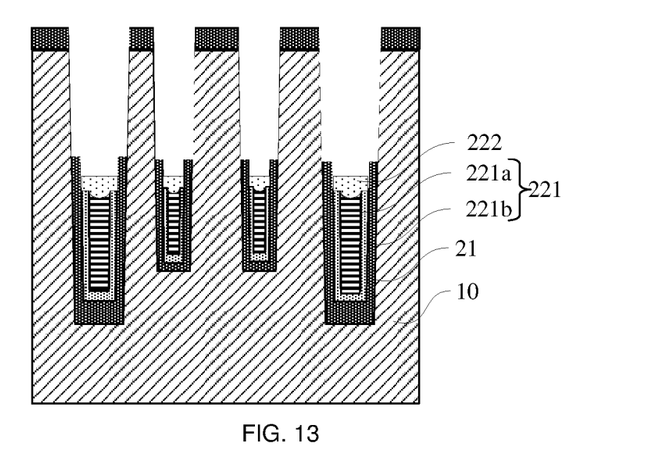
FIG. 13 is a schematic sectional view of a semiconductor structure after a first conductive layer is formed and a part of a dielectric layer is removed according to another embodiment of the present disclosure.

Optionally, in some embodiments, in order to prevent a situation wherein the dielectric layer 21 is over etched such that the top surface of the dielectric layer 21 is lower than the upper surface of the second conductive layer 222, only a part of the dielectric layer 21 exposed in the trenches 11 may be removed, such that the top surface of the dielectric layer 21 is higher than the upper surface of the second conductive layer 222 but lower than the upper surface of the substrate 10, as shown in FIG. 13. By forming the dielectric layer 21 shown in FIG. 13 in the trenches 11, the process margin can be improved. When the dielectric layer 21 on the sidewalls of the trenches 11 is etched, the dielectric layer 21 on two sides of the second conductive layer 222 is not damaged in case of over-etching to ensure electrical properties of the WL structure 20.

Figure 12:
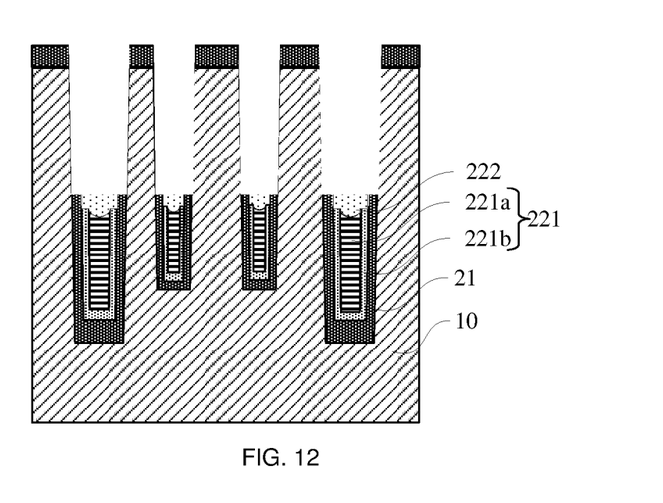
FIG. 12 is a schematic sectional view of a semiconductor structure after a first conductive layer is formed and a part of a dielectric layer is removed according to an embodiment of the present disclosure.
Figure 14:
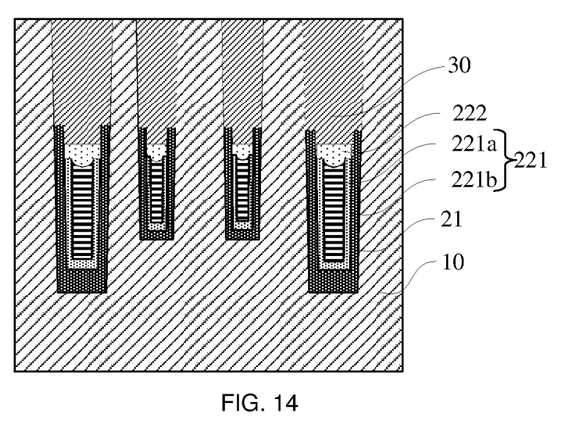
FIG. 14 is a schematic sectional view of a semiconductor structure according to still another embodiment of the present disclosure.

In some embodiment, after the semiconductor structure shown in FIG. 12 or FIG. 13 is obtained, the protective layer 30 is formed with the method in Step 40, thereby obtaining the semiconductor structure shown in FIG. 2 or the semiconductor structure shown in FIG. 14. The protective layer 30 may be, for example, a silicon nitride layer or a silicon oxynitride layer. Since the protective layer 30 completely covers the WL structure 20 in the substrate 10, the WL structure 20 is not damaged when other processes are performed on the substrate 10, making the device more stable and reliable.

The WL structure 20 manufactured with the above method may be referred to as a buried WL structure 20, and includes the first conductive layer 221 and the second conductive layer 222 made of different materials. With the different work functions, the method of manufacturing a semiconductor structure reduces the GIDL caused by the buried WL structure 20. Moreover, by doping the first component (such as the phosphorus) in the second conductive layer 222, the method of manufacturing a semiconductor structure reduces the work function of the second conductive layer 222, and weakens the repulsion of the second conductive layer 222 to the electrons, which further reduces the GIDL caused by the buried WL structure 20, lowers the power consumption, and improves the gate control capability.

It should be understood that although the steps in the flowchart of FIG. 3 are sequentially displayed according to the arrows, these steps are unnecessarily executed in the order indicated by the arrows. Unless clearly described otherwise, the execution order of the steps is not strictly limited, and these steps may be executed in other orders. Moreover, at least some of the steps in FIG. 3 may include a plurality of steps or stages. For example, Step S30 may include Step S31 and Step S32. Step S31 may further include Step S311, Step S312 and Step S313. The steps or stages are unnecessarily executed at the same time, but may be executed at different times. The steps or stages are unnecessarily carried out sequentially, but may be executed alternately with other steps or at least some of steps or stages of other steps.

Optionally, the semiconductor structure may be applied to the DRAM or other semiconductor devices. By applying the semiconductor structure in the above embodiment to the DRAM, the leakage current in the DRAM can be reduced greatly to lower the power consumption.

The technical features of the above embodiments can be employed in arbitrary combinations. To provide a concise description, all possible combinations of all technical features of the above embodiments may not be described; however, these combinations of technical features should be construed as disclosed in this specification as long as no contradiction occurs.

The above embodiments are only intended to illustrate several implementations of the present disclosure in detail, and they should not be construed as a limitation to the patentable scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:
1. A semiconductor structure, comprising:
a substrate comprising trenches arranged in parallel intervals; and
a word line structure located at a bottom of the trench, and comprising a dielectric layer and a conductive layer, wherein the dielectric layer covers a bottom surface and a sidewall of the conductive layer, the conductive layer comprises a first conductive layer and a second conductive layer, the second conductive layer is stacked on the first conductive layer, a top surface of the dielectric layer is higher than an upper surface of the second conductive layer but lower than an upper surface of the substrate, and a first component is doped in the second conductive layer.

2. The semiconductor structure according to claim 1, wherein the second conductive layer comprises a horizontal portion and a protrusive portion, and the protrusive portion is embedded into the first conductive layer.

3. The semiconductor structure according to claim 1, wherein the first component comprises an N-type doping element.

4. The semiconductor structure according to claim 3, wherein the first component has a doping concentration of $18 \times 10^{20}$ cm$^{-3}$ to $22 \times 10^{20}$ cm$^{-3}$.

5. The semiconductor structure according to claim 3, wherein a doping concentration of the first component changes gradually along a thickness direction of the second conductive layer.

6. The semiconductor structure according to claim 2, wherein the first conductive layer comprises a metal layer and a metal barrier layer; the metal barrier layer covers a bottom surface and a sidewall of the metal layer, and exposes a top of the metal layer; and the protrusive portion is embedded into the top of the metal layer.

7. The semiconductor structure according to claim 6, wherein the metal layer comprises a tungsten layer, the metal barrier layer comprises a titanium nitride layer, and the second conductive layer comprises a doped polycrystalline silicon layer.

8. The semiconductor structure according to claim 1, further comprising:
a protective layer located on an upper surface of the second conductive layer, and filling up the trench.

9. A method of manufacturing a semiconductor structure, comprising:
providing a substrate, and forming trenches arranged in parallel intervals in the substrate;
forming a dielectric layer, the dielectric layer covering a bottom and a sidewall of the trench;
forming a conductive layer in the trench, wherein the conductive layer comprises a first conductive layer and a second conductive layer, the second conductive layer is stacked on the first conductive layer, and a first component is doped in the second conductive layer; and
removing a part of the dielectric layer exposed in the trenches, such that a top surface of the remaining dielectric layer is higher than an upper surface of the second conductive layer but lower than an upper surface of the substrate.

10. The method of manufacturing the semiconductor structure according to claim 9, wherein the forming a conductive layer in the trench comprises:
forming the first conductive layer in the trench, the first conductive layer comprising a metal layer and a metal barrier layer; and
forming the second conductive layer on the first conductive layer.

11. The method of manufacturing the semiconductor structure according to claim 10, wherein the forming the first conductive layer in the trench comprises:
forming a metal barrier material layer, the metal barrier material layer covering a surface of the dielectric layer;
forming a metal material layer, the metal material layer covering a surface of the metal barrier material layer, and filling up the trench; and
removing a part of the metal material layer and a part of the metal barrier material layer, and forming the metal layer and the metal barrier layer, thereby obtaining the first conductive layer.

12. The method of manufacturing the semiconductor structure according to claim 11, wherein
the part of the metal material layer and the part of the metal barrier material layer are removed by etching; and
an etching rate to the metal material layer is increased by adjusting an etch selectivity of the metal material layer and the metal barrier material layer, thereby forming a curved recess in a top surface of the first conductive layer.

13. The method of manufacturing the semiconductor structure according to claim 12, wherein the forming the second conductive layer on the first conductive layer comprises:
forming a second conductive material layer, and doping the first component in the second conductive material layer, the second conductive material layer covering the top surface of the first conductive layer, and filling up the trench; and
removing a part of the second conductive material layer, and forming the second conductive layer.

14. The method of manufacturing the semiconductor structure according to claim 13, wherein the first component has a doping concentration of $18 \times 10^{20}$ cm$^{-3}$ to $22 \times 10^{20}$ cm$^{-3}$ in the second conductive layer.

15. The method of manufacturing the semiconductor structure according to claim 13, wherein a doping concentration of the first component changes gradually along a thickness direction of the second conductive layer.

16. The method of manufacturing the semiconductor structure according to claim 13, wherein the second conductive material layer is formed by deposition; and
a doping concentration of the first component is adjusted during the deposition.

17. The method of manufacturing the semiconductor structure according to claim 9, after the removing a part of the dielectric layer exposed in the trenches, further comprising:
forming a protective layer, the protective layer covering the top surface of the remaining dielectric layer and the upper surface of the second conductive layer, and filling up the trench.

* * * * *